(12) United States Patent
Ewanchuk et al.

(10) Patent No.: US 10,277,218 B2
(45) Date of Patent: Apr. 30, 2019

(54) SYSTEM COMPRISING MULTI-DIE POWER MODULE, METHOD FOR CONTROLLING OPERATION OF MULTI-DIE POWER MODULE, DEVICE FOR CONTROLLING OPERATION OF MULTI-DIE POWER MODULE

(71) Applicant: MITSUBISHI ELECTRIC CORPORATION, Tokyo (JP)

(72) Inventors: Jeffrey Ewanchuk, Rennes (FR); Stefan Mollov, Rennes (FR); Nicolas Voyer, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/574,029

(22) PCT Filed: Jun. 6, 2016

(86) PCT No.: PCT/JP2016/067463
§ 371 (c)(1),
(2) Date: Nov. 14, 2017

(87) PCT Pub. No.: WO2016/199929
PCT Pub. Date: Dec. 15, 2016

(65) Prior Publication Data
US 2018/0302079 A1    Oct. 18, 2018

(30) Foreign Application Priority Data
Jun. 9, 2015 (EP) .................................... 15171259

(51) Int. Cl.
*H02M 1/088* (2006.01)
*H03K 17/08* (2006.01)
*H03K 17/12* (2006.01)

(52) U.S. Cl.
CPC ............ *H03K 17/08* (2013.01); *H02M 1/088* (2013.01); *H03K 17/122* (2013.01); *H03K 2017/0806* (2013.01)

(58) Field of Classification Search
CPC ........... H03K 17/08; H03K 2017/0806; H03K 17/14; H02M 1/088; G06F 3/0616; G11C 16/3495
See application file for complete search history.

(56) References Cited

U.S. PATENT DOCUMENTS 6,316,956 B1 * 11/2001 Oglesbee .............. H02J 7/0029
                                                                 323/225
9,041,183 B2 * 5/2015 Liang ..................... H01L 25/072
                                                                 257/691
2012/0286750 A1 * 11/2012 Xu ......................... H02M 3/156
                                                                 323/282

FOREIGN PATENT DOCUMENTS

WO         WO 01/69784 A1    9/2001

OTHER PUBLICATIONS

International Search Report dated Sep. 8, 2016 for corresponding PCT/JP2016/067463.

* cited by examiner

*Primary Examiner* — Jung Kim
(74) *Attorney, Agent, or Firm* — Birch, Stewart, Kolasch & Birch, LLP (57) ABSTRACT

The present invention concerns a system comprising a multi-die power module composed of dies and a controller receiving plural consecutive input patterns for activating the dies of the multi-die power module. The dies are grouped into plural clusters of dies and the controller comprises means for outputting one gate to source signals for each cluster of dies, each outputted gate to source signal being different from the other gate to source signals and at least (Continued)

one first outputted gate to source signal reducing the activation of dies during at least one input pattern among the plural input patterns.

10 Claims, 8 Drawing Sheets

SYSTEM COMPRISING MULTI-DIE POWER MODULE, METHOD FOR CONTROLLING OPERATION OF MULTI-DIE POWER MODULE, DEVICE FOR CONTROLLING OPERATION OF MULTI-DIE POWER MODULE

TECHNICAL FIELD

The present invention relates generally to a system and a method for controlling the operation of a multi-die power module.

BACKGROUND ART

Multi-die power modules are classically composed of several parallel connected power dies and are used for increasing the current capability over that of a single power die.

For example, a three-phase converter is composed of four parallel power dies per switch, giving twenty four power dies in total.

Emerging devices technologies, such as SiC (Silicon Carbide) and GaN (Gallium Nitride) Transistors, are typically realized in high current density, small power dies due to limitations of yield and cost of wafer substrate.

In order to realize higher power SiC-based modules, a multitude of parallel connected SiC dies is necessary. Unlike parallel connected modules, parallel connected dies constitute a single switch that ideally commutates the same load current.

SUMMARY OF INVENTION

Technical Problem

However, regardless of the type of die used, i.e. diodes or voltage-driven switch, e.g. MOSFETs (Metal Oxide Semiconductor Field Effect Transistor), characteristics exist within the dies that limit the balanced sharing of the load current both statically and dynamically.

Furthermore, the temperature of each die within the multi-die power module is influenced by its geometric location on the substrate. Such temperature difference does not result in full utilization of the die, and thus, more dies are needed in parallel to achieve a given current rating, thereby increasing the overall costs and physical surface area of the power module.

Balancing the temperature of the dies may be solved by a feedback control.

For current feedback control loop, high speed and high accuracy sensors and processors must be used.

For temperature feedback control, extra components have an impact on costs, weight, volume and power consumption of the power module.

Figure 1:
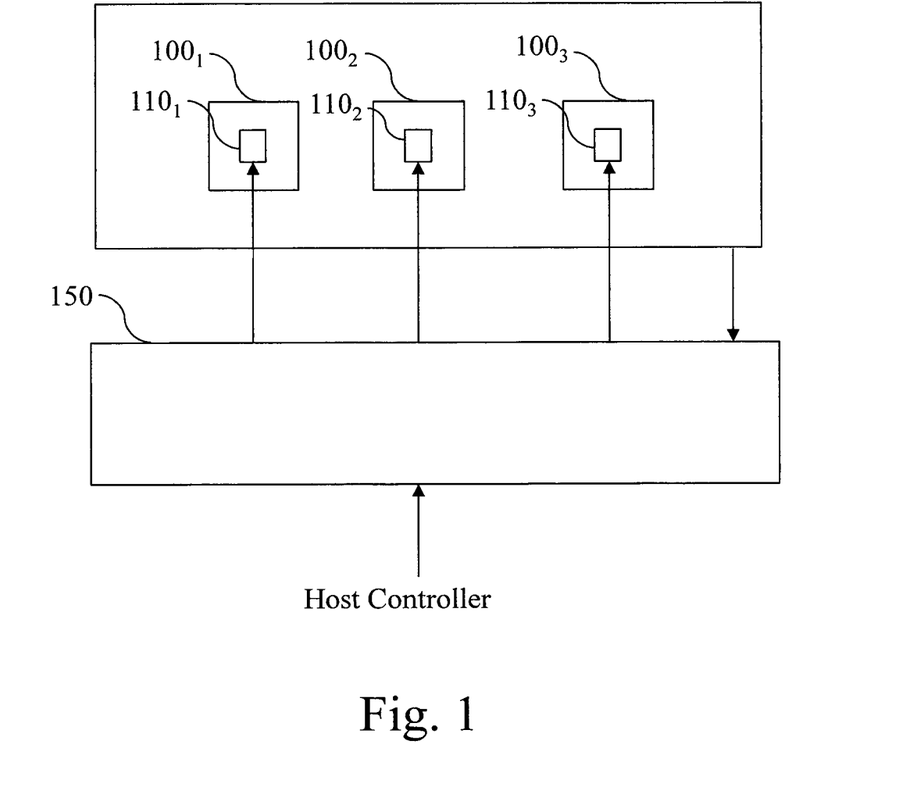
FIG. 1 represents an example of a system for controlling the operation of a multi-die power module according to prior art.

An example of such feedback control is given in reference to FIG. 1.

FIG. 1 represents an example of a system for controlling the operation of a multi-die power module according to prior art.

The multi-die power module 10 is for example composed of three dies noted $100_1$ to $100_3$.

The system for controlling the operation of a multi-die power module 10 comprises a controller 150 which receives, from a host controller, a control signal to be applied to the multi-die power module 10 and modifies the control signal individually per die according to sensed currents and/or sensed temperature prior to controlling the dies with the modified signals.

The control signals modified individually per die are individually fed to individual gate connectors noted $110_1$ to $110_3$ of dies $100_1$ to $100_3$.

Solution to Problem

The present invention aims at enhancing the balancing of the temperature of the dies and then to increase the maximum capability of a multi-die power module without need to implement highly dynamic control.

To that end, the present invention concerns a system comprising a multi-die power module composed of dies and a controller receiving plural consecutive input patterns for activating the dies of the multi-die power module, characterized in that the dies are grouped into plural clusters of dies and in that the controller comprises means for outputting one gate to source signals for each cluster of dies, each outputted gate to source signal being different from the other gate to source signals and at least one first outputted gate to source signal reducing the activation of dies during at least one input pattern among the plural input patterns.

Thus, the electrical losses of dies can be varied across clusters. As cluster contains at least one die, the number of means for outputting one gate to source signals is limited with respect with the number of dies.

According to a particular feature, the reduction of the activation of dies during at least one input pattern among the plural input patterns is performed by disabling the activation of dies during the at least one input pattern.

Thus, conducting and switching losses of dies in the at least one first cluster are null during the at least one input pattern. Loss across dies of different clusters can get steered to any loss profile.

According to a particular feature, the dies are grouped into clusters according to their location within the multi-die power module.

Thus, dies sharing similar cooling ability e.g. due to distance to cold heat source, or presence of surrounding heat source are easily clustered. When experiencing identical losses, the dies of a cluster will also experience identical junction temperature.

According to a particular feature, the dies are grouped into clusters according to their number of neighboring dies within the multi-die power module.

Thus, dies sharing similar cooling ability e.g. due to distance to cold heat source, or presence of surrounding heat source are easily clustered. When experiencing identical losses, the dies of a cluster will also experience identical junction temperature.

Thus, electrical losses of dies can be varied across clusters as a function of the cooling ability of the dies. Die loss profile can be adapted across clusters to compensate for the different die cooling ability across clusters. As a result, the die temperatures can get balanced to a same junction temperature across the entire multi-chip module. As the thermal stress becomes identical across the dies, the aging of dies also get balanced. The multi-die power module can get dimensioned for the average junction temperature rather than for the peak die temperature, enabling operation at higher currents, and/or higher lifetime of the power module.

According to a particular feature, at least one second outputted gate to source signal is identical to the plural input patterns.

Thus, the dies with best cooling ability are never deactivated. To achieve the loss profile able to reach well balanced temperatures, it is therefore less needed to deactivate other dies with worse cooling ability. As a result, the current is better shared across dies, and a higher number of dies simultaneously contributes to sharing of current.

According to a particular feature, the controller comprises storage means for storing information related to the reduction of the activation of dies during at least one input pattern among the plural input patterns.

Thus, the deactivation of clusters can be realized in an open-loop way, without need for sensing, estimating, acquiring or processing the individual junction temperature across dies or clusters. As information related to the reduction of the activation is precomputed, the implementation of the control of the multi-die power module is simple.

According to a particular feature, the controller further comprises:
    means for sequencing the information related to the reduction of the activation of dies according to the received consecutive input patterns,
    means for building outputted gate to source signal of each cluster from the sequenced information and from the consecutive input patterns.

Thus, the deactivation of clusters can be realized in an open-loop way, without need for sensing or estimating individual junction temperature across dies or clusters. As information related to the reduction of the activation is precomputed, the implementation of the control of the multi-die power module is simple.

According to a particular feature, the means for building outputted gate to source signal of each cluster skip the activation pulse of an input pattern when information related to the reduction of activation of dies indicates a deactivation for the input pattern or recopy the input pattern when information related to the reduction of activation of dies does not indicate a deactivation for the input pattern.

Thus, the building of outputted gate to source signal is straightforward from the input pattern. When a cluster skips the activation pulse, the dies will not contribute to the conduction and switching losses of the multi-die power module during the input pattern.

According to a particular feature, the means for building outputted gate to source signal of each cluster shorten the activation pulse of an input pattern when information related to the reduction of activation indicates a deactivation for the input pattern or recopy the input pattern when information related to the reduction of activation does not indicate a deactivation for the input pattern.

Thus, when the activation pulse is shortened for a cluster, the dies will not contribute to the switching losses of the multi-die power module during the input pattern, but will contribute to the conduction losses. As the dynamic losses in each die are typically linear with respect to the commutation current, the controllability of the multi-die power module towards balanced temperatures is increased.

The present invention concerns also a method for controlling the operation of a multi-die power module composed of dies characterized in that the method comprises the steps executed by a controller of:
    receiving plural consecutive input patterns for activating the dies of the multi-die power module,
    outputting one gate to source signals for each cluster of dies, each outputted gate to source signal being different from the other gate to source signals and at least one first outputted gate to source signal reducing the activation of dies during at least one input pattern among the plural input patterns.

Thus, the electrical losses of dies can be varied across clusters. As cluster contains more than one die, the number of means for outputting one gate to source signals is limited with respect with the number of dies.

The present invention concerns also a device for controlling the operation of a multi-die power module composed of clusters of dies characterized in that the device comprises:
    means for receiving plural consecutive input patterns for activating the dies of the multi-die power module,
    means for outputting one gate to source signals for each cluster of dies, each outputted gate to source signal being different from the other gate to source signals and at least one first outputted gate to source signal reducing the activation of dies during at least one input pattern among the plural input patterns.

Thus, the electrical losses of dies can be varied across clusters. As cluster contains at least one die, the number of means for outputting one gate to source signals is limited with respect with the number of dies.

The characteristics of the invention will emerge more clearly from a reading of the following description of example embodiments, the said description being produced with reference to the accompanying drawings, among which:

DESCRIPTION OF EMBODIMENTS

Figure 2:
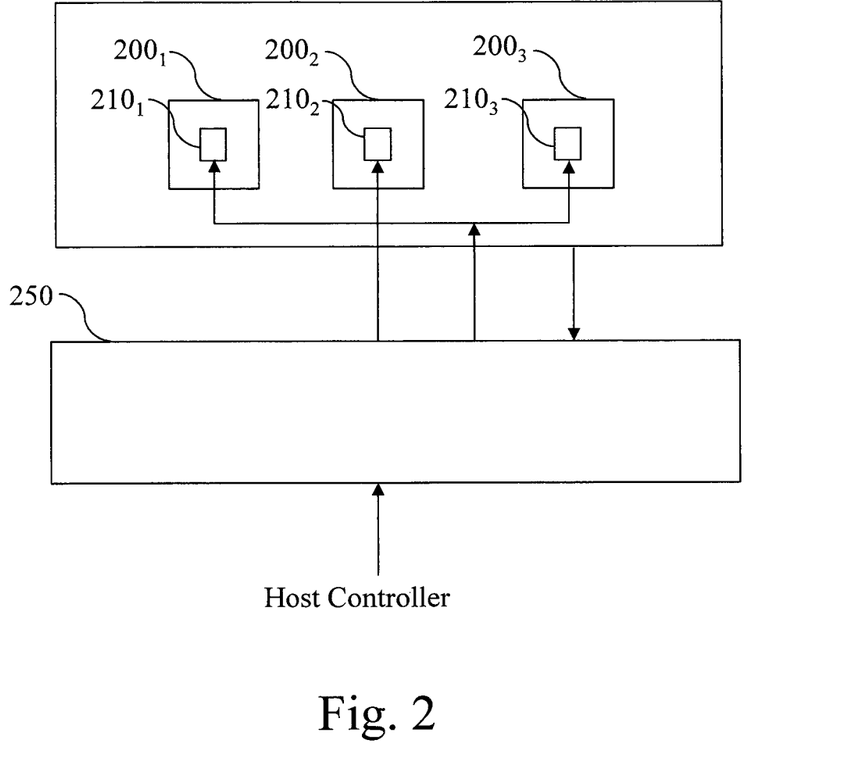
FIG. 2 represents an example of a system for controlling the operation of a multi-die power module according to the present invention.

FIG. 2 represents an example of a system for controlling the operation of a multi-die power module according to the present invention.

The multi-die power module 20 is for example composed of three dies noted $210_1$ to $210_3$.

The system for controlling the operation of a multi-die power module 20 comprises a controller 250 which receives, from a host controller, an input control signal to be applied to the multi-die power module 20 and modifies it according to a table stored in the memory of the controller 250 and containing activation patterns for each cluster.

As example, the input signal is modified by skipping at least one activation period so that the die controlled by the modified signal does not experience conduction losses, or the signal is modified by shortening the activation period so that the die controlled by the modified signal experiences less switching losses.

According to the invention, clusters of dies are determined, and the controller 250 provides, for each cluster of dies, a Gate to Source signal for driving the dies of the cluster according to the activation pattern and to the input control signal.

The activation patterns used for the clusters are different from each other.

For example, the multi-die power module 20 is divided into three clusters $200_1$, $200_2$ and $200_3$.

A first cluster $200_1$ comprises the die noted $210_1$.
A second cluster $200_2$ comprises the die noted $210_2$.
A third cluster $200_3$ comprises the die noted $210_3$.

The clusters are for example defined according to symmetry axis and the position of the dies within the multi-die power module 20.

In a variant, the first and third clusters are grouped in order to form a single cluster.

In the example of FIG. 2, dies which have two neighbour dies belong to the second cluster. Dies which have one neighbour die belong to the first or the third cluster. Dies which have four neighbour dies belong to the third cluster.

The cooling ability of a die depends on the number of surrounding dies. The higher the number of surrounding dies is, the lower heat can be dissipated in the die, and, if same losses are dissipated in each die, the higher the die temperature is.

Clusters are for example determined at the manufacturing of the multi-die power module 20.

Figure 3:
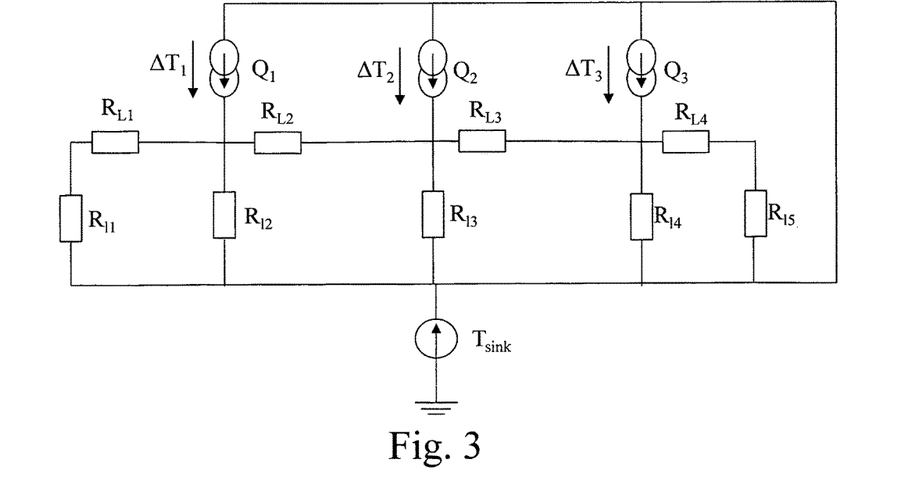
FIG. 3 represents a simplified equivalent thermal circuit for dies at a thermal steady state in a multi-die power module.

Such behaviour is described in more details in reference to FIG. 3.

FIG. 3 represents a simplified equivalent thermal circuit for dies at a thermal steady state in a multi-die power module.

The FIG. 3 represents a simplified thermal circuit for three neighbour dies, where the dominant heat paths are from die to die and die to case. The heat sink enables the heat transfer of power losses to the outside of the multi-die power module package experiencing a sink temperature $T_{sink}$.

By analogy with electrical circuit, heat source $Q_1$ to $Q_3$ resulting from conduction or switching losses experienced by power dies can be viewed as current source, temperature rise $\Delta T_1$ to $\Delta T_3$ above sink temperature can be viewed as voltages, materials $R_{L1}$ to $R_{L4}$, $R_{J1}$ to $R_{J5}$ behave as thermal resistances, with thermal conductivity being related to the resistance and thermal capacity as capacitance.

$R_{L2}$ to $R_{L3}$ represent thermal paths between the three neighbour dies. $R_{J2}$ to $R_{J3}$ represent thermal path between power dies and heat sink. $R_{L1}$ and $R_{L4}$ represent additional thermal paths located at the edges of the power module and/or heat sink.

In spite of balancing of losses across parallel dies ($Q_1=Q_2=Q_3$), the temperature rise of the dies ($\Delta T_1$, $\Delta T_2$, $\Delta T_3$) is unbalanced due to uneven crowding of dies. This temperature imbalance is the cause for difference of thermal stress across dies, and thus difference of aging across dies. As a result, the lifetime of the multi-die power module 20 is determined by the lifetime of the most stressed die, regardless of the lifetime of the less stressed die.

Figure 4A:
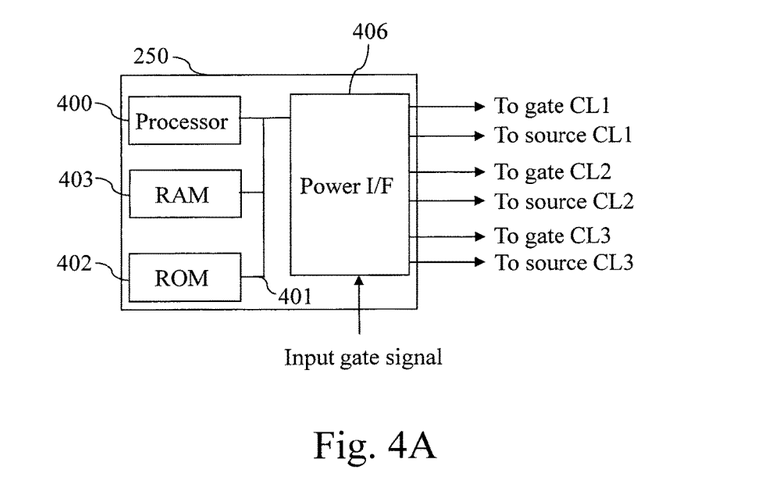
FIG. 4A represents a first example of an architecture of a controller for controlling the operation of a multi-die power module according to the present invention.

FIG. 4A represents a first example of an architecture of a controller for controlling the operation of a multi-die power module according to the present invention.

The controller 250 has, for example, an architecture based on components connected together by a bus 401 and a processor 400 controlled by a program in order to adjust Gate to Source signals CL to be provided for the different clusters.

The bus 401 links the processor 400 to a read only memory ROM 402, a random access memory RAM 403 and a power interface 406.

The memory 403 contains registers intended to receive variables and the activation pattern of the different clusters.

If the activation patterns are determined in real time, the memory 403 contains the instructions of the program related to the algorithm which adjusts Gate to Source signals CL to be provided for the different clusters.

The processor 400 receives an input gate signal pattern to be applied to the multi-die power module and determines for each activation cycle of the input gate signal pattern and for each cluster the activation of the dies of the clusters according to the activation pattern.

The power interface 406 builds the Gate to Source signal CL1 using the activation pattern of the first cluster. The power interface 406 builds the Gate to Source signal CL2 using the activation pattern of the second cluster. The power interface 406 builds the Gate to Source signal CL3 using the activation pattern of the third cluster.

For each cluster, the gate to Source signal is a recopy of the input gate signal when the processor 400 has determined the activation of the dies of the cluster according to the activation pattern.

The gate to Source signal skips the activation of the input gate signal when the processor 400 has not determined the activation of the dies of the cluster according to the activation pattern.

In a variant, the gate to Source signal shortens the activation of the input gate signal when the processor 400 has not determined the activation of the dies of the cluster according to the activation pattern.

Figure 5:
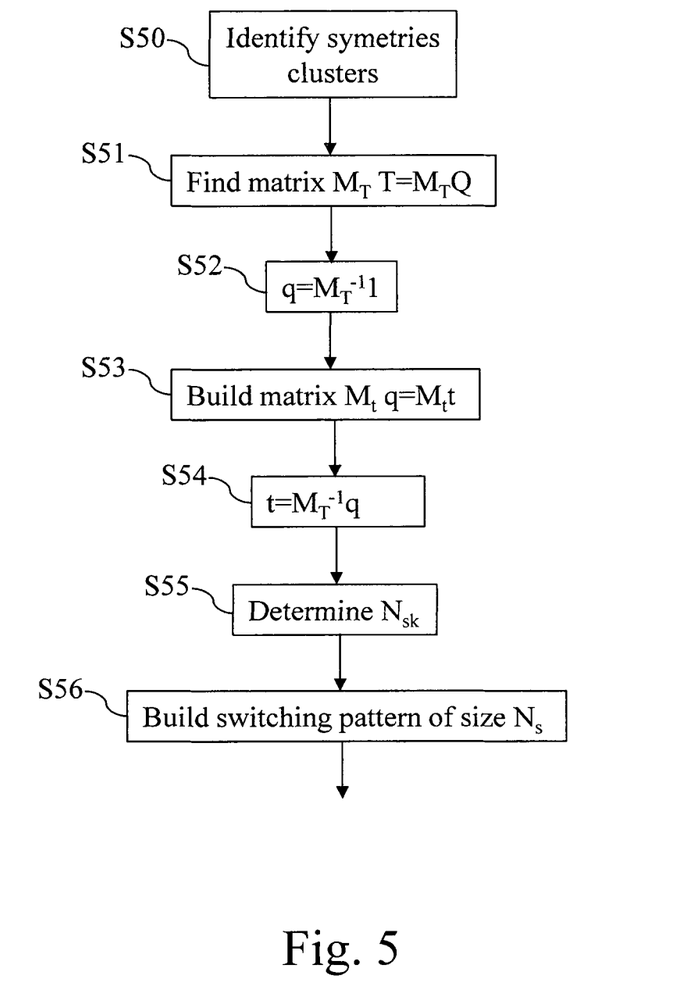
FIG. 5 represents an algorithm for determining power patterns for controlling the operation of a multi-die power module according to the present invention.

The read only memory 2 contains instructions of the programs related to the algorithm disclosed in FIG. 5, which are transferred, when the controller 250 is powered on, to the random access memory 403.

The controller 250 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the controller 250 includes circuitry, or a device including circuitry, causing the controller 250 to perform the algorithm disclosed in FIG. 5.

The controller 250 may be realized, for example, by a pre-programmed CPLD (Complex Programmable Logic Device).

Figure 4B:
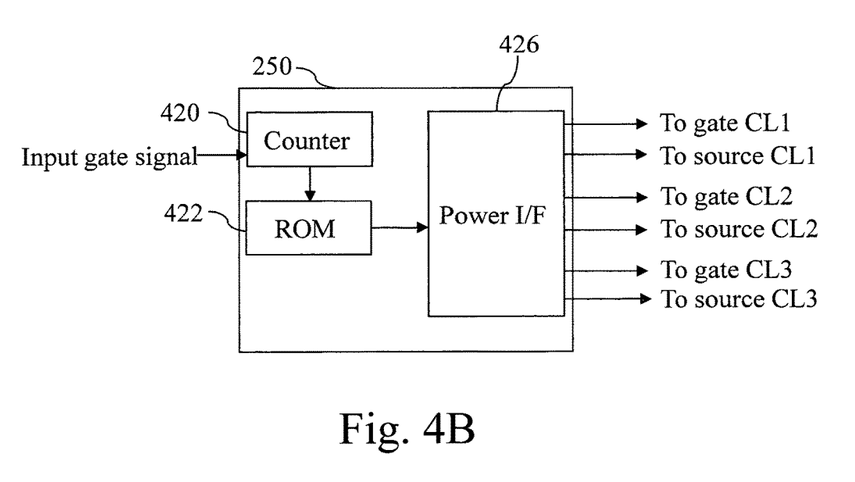
FIG. 4B represents a second example of an architecture of a controller for controlling the operation of a multi-die power module according to the present invention.

FIG. 4B represents a second example of an architecture of a controller for controlling the operation of a multi-die power module according to the present invention.

The controller 250 has, for example, an architecture based on a sequencer like a counter 420, a read only memory ROM 422 and a power interface 426.

The read only memory ROM 422 memorizes the power patterns to be provided to the different clusters.

The sequencer 420 receives an input gate signal pattern to be applied to the multi-die power module and commands the ROM 422 in order to provide for each cluster, the power pattern to be applied to the dies of the clusters. The Gate to Source signal CL1 is fed to the dies of the first cluster. The Gate to Source signal CL2 is fed to the dies of the second cluster. The Gate to Source signal CL3 is fed to the dies of the third cluster.

FIG. 5 represents an algorithm for determining power patterns for controlling the operation of a multi-die power module according to the present invention.

The present algorithm may be executed by the processor 400 of the controller 250 or may be executed during the design of the multi-die power module 20.

Basically, the present algorithm creates unbalanced power losses that fits a suitable distribution, which compensates the thermal unbalance. As a result, temperatures of the dies 200 of the multi-die power module 20 are balanced.

At step S50, the processor 400 determines symmetry axes and the position of the dies within the multi-die power module 20.

For example, the multi-die power module 20 is divided into three clusters.

The first cluster $200_1$ comprises the die noted $210_1$.

The second cluster $200_2$ comprises the die noted $210_2$.

The third cluster $200_3$ comprises the die noted $210_3$.

At next step S51, the processor 400 obtains a matrix $M_T$. The matrix $M_T$ is such as $T=M_TQ$.

In steady state, there exists a linear relationship that links thermal losses with temperature, which can be expressed as $M_TQ=T$, where T represents a vector of temperature of the multi-die power module 20 or of cluster of the multi-die power module 20 at steady state, while Q represents the vector of losses of the multi-die power module 20. The matrices T and Q are determined through measurements and/or simulations during the design of the multi-die power module 20. $M_T$ is a linear matrix.

The Matrix $M_T$ essentially results from geometry design of power module, and as example could be measured once a first sample of multi-die power module 20 has been manufactured.

As other example, the thermal network can be estimated from the design (geometry & material) of the multi-die power module 20, e.g. using 3DCAD systems. Once known the thermal network parameters e.g. $R_L$ and $R_j$ as disclosed in reference to FIG. 3, the relation between losses and temperature is linear and can be formally identified using e.g. Thevenin-Norton theorem, or using loop and node equations. Then, the loss distribution required to achieve balanced temperature is easily determined using identified linear relations.

At next step S52, the processor 400 determines the loss profile q required to balance temperatures across dies. $q=M_T^{-1}(1 \ldots 1)$.

At next step S53, the processor 400 builds a matrix $M_t$. The columns of the matrix $M_t$ indicate the expected loss per die profile across clusters when the pattern for driving the dies of a given cluster is modified according to the present invention. According to a first example, the coefficients $M_{ti,j}$, where i and j denote the lines of the matrix $M_t$, are determined as follows:

$M_{t\,i,i}=\forall i$ and $M_{t\,i,j}=N/(N-N_{di})$ where N is the number of power dies of the multi-die power module 20 and $N_{di}$ is the number of power dies of the i-th cluster.

According to a second example, the first column of the matrix $M_t$ indicates the loss profile across clusters when the patterns for driving the dies of all clusters are not modified. The coefficients $M_{ti,j}$, where i and j denote the lines of the matrix $M_t$, are determined as follows:

$M_{t\,i,1}=1\,\forall i;\ M_{t\,i,j}=N/(N-N_{di})\,\forall j\neq N$ $M_{t\,i,j}=0\,\forall i\neq 1$ At next step S54, the processor 400 determines a weighting vector t required to realise the desired loss profile q, such as $t=M_t^{-1}q$.

When the ratios across clusters of deactivated cycles versus the total number of switching cycles are proportional to coefficients $t_k$ of the weighting vector t, the loss profile realised over the total number of switching cycles matches the determined vector q and the temperature profile matches the unicity vector. At next step S55, the processor 400 determines, for each cluster, an integer number $N_{sk}$.

For example $N_{sk}=\mathrm{round}(t_k*N_s)$ where $N_s$ is the total number of patterns. Integer numbers $N_{sk}$ and $N_s$ are determined to minimise the distance to determined weighting vector t.

At next step S56, the processor 400 determines activation patterns of clusters from the determined numbers $N_{sk}$.

Examples of patterns are given in FIG. 6.

FIG. 6 represent examples of power pattern used by the controller for controlling the operation of a multi-die power module according to the present invention.

Figure 6A:
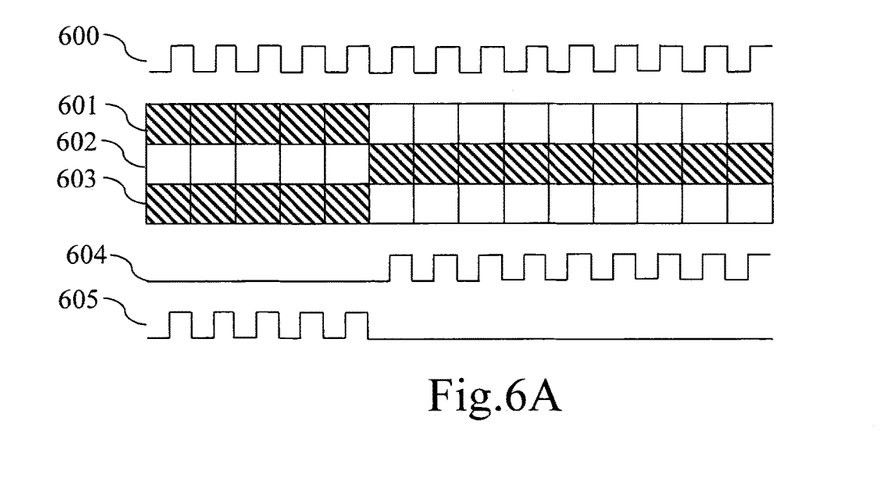
FIG. 6A represents an example of power pattern used by the controller for controlling the operation of a multi-die power module according to the present invention.
Figure 6B:
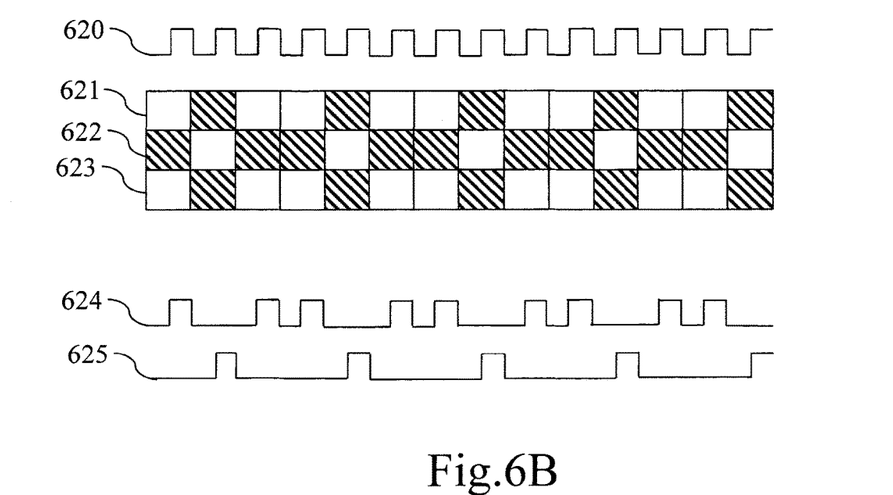
FIG. 6B represents an example of power pattern used by the controller for controlling the operation of a multi-die power module according to the present invention.

The FIGS. 6A and 6B represent examples of activation pattern of clusters of a multi-die power module.

Figure 6C:
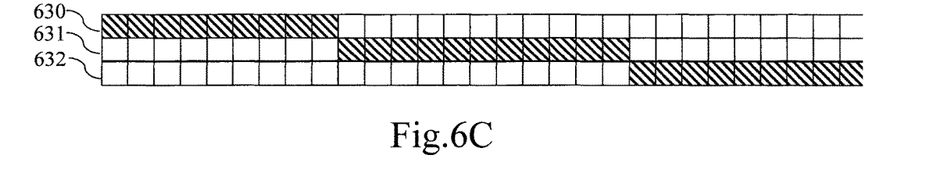
FIG. 6C represents an example of power pattern used by the controller for controlling the operation of a multi-die power module according to the present invention.
Figure 6D:
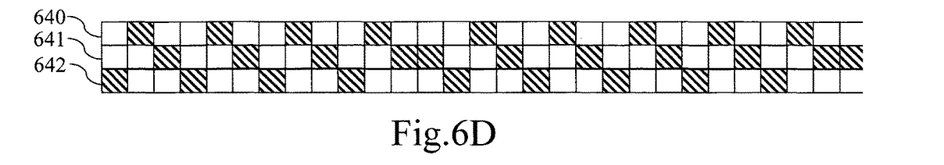
FIG. 6D represents an example of power pattern used by the controller for controlling the operation of a multi-die power module according to the present invention.
Figure 6E:
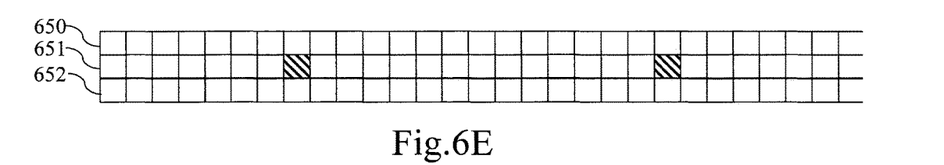
FIG. 6E represents an example of power pattern used by the controller for controlling the operation of a multi-die power module according to the present invention.

In the examples of FIGS. 6A, 6B and 6E, the multi-die power module is decomposed into two clusters. A first cluster comprises two dies and a second cluster comprises a single die which is located between the dies of the first cluster.

Then, according to the first example, the algorithm of FIG. 5 provides for example the following results:

$$N_d = \begin{vmatrix} 2 \\ 1 \end{vmatrix}$$

$$q = \begin{vmatrix} 0.526 \\ 0.474 \end{vmatrix}$$

$$M_t = \begin{bmatrix} 0 & 3/2 \\ 3 & 0 \end{bmatrix}$$

$$t = \begin{vmatrix} 0.175 \\ 0.315 \end{vmatrix}$$

$$N_s = \begin{vmatrix} 5 \\ 9 \end{vmatrix}$$

The pattern noted 600 is the input gate signal.

The pattern noted 601 is the activation pattern of a first die of the first cluster, the pattern noted 602 is the activation pattern of the die of the second cluster and the pattern noted 603 is the activation pattern of the second die of the first cluster.

The hatched areas of 601, 602 and 603 represent an inactive switching and blank areas represent an active switching. In a variant, the hatched areas of 601, 602, 603, represent switching cycles where Gate to Source signal is modified to achieve less switching losses and blank areas represent switching cycles where Gate to Source signal is not modified and equals the input gate signal. As a result, the Gate to Source signal of the first cluster is noted 604 and comprises 5 consecutive inactive switching periods. The Gate to Source signal of the second cluster is noted 605 and comprises 9 consecutive active switching periods. It should be noted that when a cluster is inactive, the other clusters are active.

The pattern noted 620 is the input gate signal.

The pattern noted 621 is the activation pattern of a die of the first cluster, the pattern noted 622 is the activation pattern of the die of the second cluster and the pattern noted 623 is the activation pattern applied to the second die of the first cluster.

The hatched areas of 621, 622 and 623 represent an inactive switching and blank areas represent an active switching.

As a result, the Gate to Source signal of the first cluster is noted 624 and comprises 5 inactive switching periods while the Gate to Source signal of the second cluster is noted 625 and comprises 9 inactive switching periods. Inactivation periods across clusters are interleaved to spread the heat stress over the total number of switching cycles.

The FIGS. 6C and 6D represent examples of power pattern to apply on clusters of a multi-die power module.

In the examples of FIGS. 6C and 6D, the multi-die power module is decomposed into three clusters.

Then, the algorithm of FIG. 5 provides for example the following results:

$$N_d = \begin{matrix} 1 \\ 1 \\ 1 \end{matrix}$$

$$q = \begin{matrix} 0.345 \\ 0.310 \\ 0.345 \end{matrix}$$

$$M_t = \begin{matrix} 0 & 3/2 & 3/2 \\ 3/2 & 0 & 3/2 \\ 3/2 & 3/2 & 0 \end{matrix}$$

$$t = \begin{matrix} 0.1034 \\ 0.1264 \\ 0.1034 \end{matrix}$$

$$N_s = \begin{matrix} 9 \\ 11 \\ 9 \end{matrix}$$

The pattern noted 630 is the activation pattern of a die of the first cluster, the pattern noted 631 is the activation pattern of the die of the second cluster and the pattern noted 632 is the activation pattern of the die of the third cluster.

The pattern noted 640 is the activation pattern of a die of the first cluster, the pattern noted 641 is the activation pattern of the die of the second cluster and the pattern noted 642 is the activation pattern of the die of the third cluster.

The hatched areas of 630, 631, 632, 640, 641 and 642 represent an inactive switching and blank areas represent an active switching.

The FIG. 6E represent examples of power pattern to apply on clusters of a multi-die power module according to the second example.

Then, the algorithm of FIG. 5 provides for example the following results:

$$N_d = \begin{matrix} 2 \\ 1 \end{matrix}$$

$$q = \begin{matrix} 0.526 \\ 0.474 \end{matrix}$$

$$M_t = \begin{matrix} 1 & 3/2 \\ 1 & 0 \end{matrix}$$

$$t = \begin{matrix} 0.474 \\ 0.035 \end{matrix}$$

$$N_s = \begin{matrix} 27 \\ 2 \end{matrix}$$

The pattern noted 650 is the activation pattern of a die of the first cluster, the pattern noted 651 is the activation pattern of the die of the second cluster and the pattern noted 652 is the activation pattern of the die of the third cluster.

The hatched areas of 650, 651, 652 represent an inactive switching and blank areas represent an active switching.

According to the second example, dies of first cluster are always deactivated. Dies of second cluster are deactivated only during two input patterns out of twenty-nine consecutive input patterns.

Figure 7A:
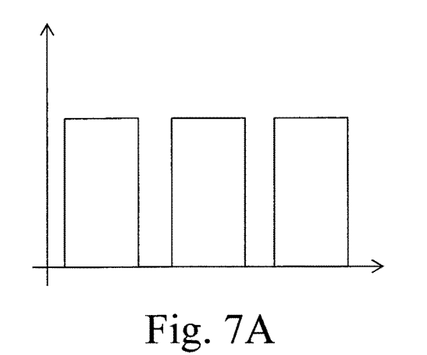
FIG. 7A represents the power loss per die when the invention is not implemented.
Figure 7B:
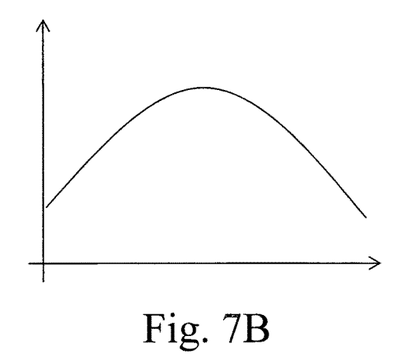
FIG. 7B represents the temperature per die when the invention is not implemented.

FIG. 7 represent the power loss and temperature per die when the invention is not implemented.

FIG. 7A shows the power loss per die profile across clusters of dies. The horizontal axis represents the die, the vertical axis shows the power loss of the corresponding die. Power loss is balanced across all dies.

FIG. 7B shows the junction temperature of dies. The horizontal axis represents the die, the vertical axis shows the junction temperature of the corresponding die. Dies located at the edge of the multi-die power module experience better cooling, and their temperature is relatively smaller than that of the die located at the heart of the multi-die power module.

Figure 8A:
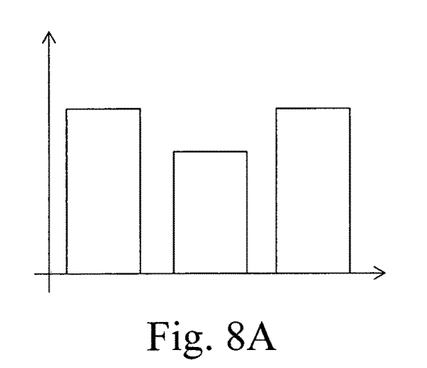
FIG. 8A represents the power loss per die according to the invention.
Figure 8B:
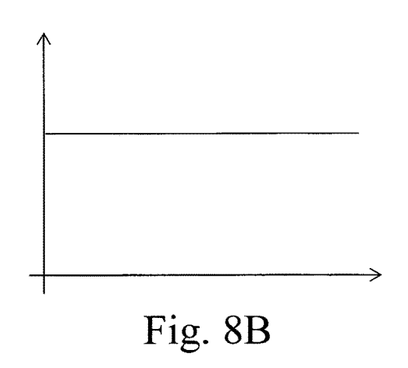
FIG. 8B represents the temperature per die according to the invention.

FIG. 8 represent the power loss and temperature per die according to the invention.

FIG. 8A shows the power loss per die profile across clusters of dies. The horizontal axis represents the die, the vertical axis shows the power loss of the corresponding die. Power loss is umbalanced across dies according to the present invention. The die located at the edge of the multi-die power module is configured to experience a higher level of losses than the die located at the heart of the multi-die power module.

FIG. 8B shows the junction temperature of dies. The horizontal axis represents the die, the vertical axis shows the junction temperature of the corresponding die. The better cooling ability of dies located at the edge of the multi-die power module is compensated by the higher contribution to power losses. As a result, the temperature is balanced across dies.

Naturally, many modifications can be made to the embodiments of the invention described above without departing from the scope of the present invention.

The invention claimed is:

1. System comprising:
a multi-die power module composed of dies connected in parallel; and
a controller receiving an input signal comprising plural consecutive input patterns indicating when the dies of the multi-die power module need to be activated, wherein
the dies are grouped into at least two clusters of dies according to the location of the dies within the multi-die power module, each cluster comprising at least one die,
the controller comprises means for outputting one gate to source signal per cluster, each outputted gate to source signal being different from the other gate to source signals,
at least one outputted gate to source signal does not activate the at least one die of one cluster during at least a part of one input pattern among the plural input patterns of the input pattern, and
the controller further comprises a storage for storing information related to the non-activating of dies during at least one input pattern among the plural input patterns.

2. System according to claim 1, wherein the at least one outputted gate to source signal does not activate the at least one die of one cluster during at least one input pattern among the plural input patterns of the input pattern.

3. System according to claim 1, wherein the location of dies within the multi-die power module is representative of the number of neighboring dies within the multi-die power module.

4. System according to claim 1, wherein at least one other outputted gate to source signal activate the at least one die of one other cluster during each input pattern among the plural input patterns of the input.

5. System according to claim 1, wherein the controller further comprises:
means for sequencing the information related to the non activating of dies according to the received consecutive input patterns,
means for building outputted gate to source signal of each cluster from the sequenced information and from the consecutive input patterns.

6. System according to claim 5, wherein the means for building outputted gate to source signal of each cluster skip an activation pulse of an input pattern when information related to the reduction of activation of dies indicates a deactivation for the input pattern or recopy the input pattern when information related to the reduction of activation of dies does not indicate a deactivation for the input pattern.

7. System according to claim 5, wherein the means for building outputted gate to source signal of each cluster shorten an activation pulse of an input pattern when information related to the reduction of activation indicates a deactivation for the input pattern or recopy the input pattern when information related to the reduction of activation does not indicate a deactivation for the input pattern.

8. Method for controlling the operation of a multi-die power module composed of dies connected in parallel, wherein the dies are grouped into at least two clusters of dies according to the location of the dies within the multi-die power module, each cluster having at least one die, the method comprising the steps executed by a controller of:
receiving an input signal comprising plural consecutive input patterns indicating when the dies of the multi-die power module need to be activated,
outputting one gate to source signal per cluster, each outputted gate to source signal being different from the other gate to source signals and wherein at least one outputted gate to source signal does not activate the at least one die of one cluster during at least a part of one input pattern among the plural input patterns of the input pattern,
wherein the controller comprises a storage for storing information related to the non-activating of dies during at least one input pattern among the plural input patterns.

9. Method according to claim 8, wherein the at least one outputted gate to source signal does not activate the at least one die of one cluster during at least one input pattern among the plural input patterns of the input pattern.

10. Method according to claim 8, wherein at least one other outputted gate to source signal activate the at least one die of one other cluster during each input pattern among the plural input patterns of the input.

* * * * *